United States Patent
Matsumoto et al.

(10) Patent No.: US 8,122,405 B2
(45) Date of Patent: Feb. 21, 2012

(54) DELAY ADJUSTING METHOD AND LSI THAT USES AIR-GAP WIRING

(75) Inventors: Takashi Matsumoto, Hamura (JP); Junji Noguchi, Akishima (JP); Takayuki Oshima, Ome (JP)

(73) Assignee: Hitachi, Ltd., Tokyo (JP)

( * ) Notice: Subject to any disclaimer, the term of this patent is extended or adjusted under 35 U.S.C. 154(b) by 513 days.

(21) Appl. No.: 12/253,469

(22) Filed: Oct. 17, 2008

(65) Prior Publication Data
US 2009/0106718 A1 Apr. 23, 2009

(30) Foreign Application Priority Data
Oct. 18, 2007 (JP) ................................ 2007-270820

(51) Int. Cl.
*G06F 17/50* (2006.01)
(52) U.S. Cl. ........ 716/110; 716/100; 716/113; 716/119; 716/126; 716/132; 716/134
(58) Field of Classification Search .................. 716/104, 716/106, 108, 111, 113, 132, 134, 100, 110, 716/118, 119, 126
See application file for complete search history.

(56) References Cited

U.S. PATENT DOCUMENTS

| | | | | |
|---|---|---|---|---|
| 5,253,182 A * | 10/1993 | Suzuki | ............................ | 430/30 |
| 5,310,700 A * | 5/1994 | Lien et al. | ...................... | 438/618 |
| 5,798,937 A * | 8/1998 | Bracha et al. | .................... | 716/54 |
| 6,093,633 A * | 7/2000 | Matsumoto | .................... | 438/622 |
| 7,073,142 B2 * | 7/2006 | Kodama et al. | .................. | 716/52 |
| 7,698,671 B2 * | 4/2010 | Fujii et al. | ...................... | 716/106 |
| 7,795,920 B2 * | 9/2010 | Yasuda | ........................... | 326/93 |
| 2008/0097641 A1 * | 4/2008 | Miyashita et al. | ............ | 700/121 |

FOREIGN PATENT DOCUMENTS

| JP | 2003-297918 | 10/2003 |
|---|---|---|
| JP | 2003-338546 | 11/2003 |

* cited by examiner

*Primary Examiner* — Sun Lin
(74) *Attorney, Agent, or Firm* — Mattingly & Malur, PC

(57) ABSTRACT

Provided is a method for manufacturing a semiconductor integrated circuit device which enables a timing optimization without giving additions to a manufacturing process and increasing cost and TAT. Existence of a timing constraint violation is determined, and when a timing constraint violation is detected, to dissolve the violation, a void formation inhibition zone is set up in a part or all of a spacing (inter-wiring spacing) between an optimization-target wiring which needs a further delay time of a signal and clock and an adjacent wiring adjacent to the optimization-target wiring having a spacing within a specified wiring spacing, and an insulating film is formed in a spacing (inter-wiring spacing) between the optimization-target wiring and the adjacent wiring in the void formation inhibition zone, and voids are formed in a spacing (inter-wiring spacing) between the optimization-target wiring and the adjacent wiring outside the void formation inhibition zone.

28 Claims, 11 Drawing Sheets

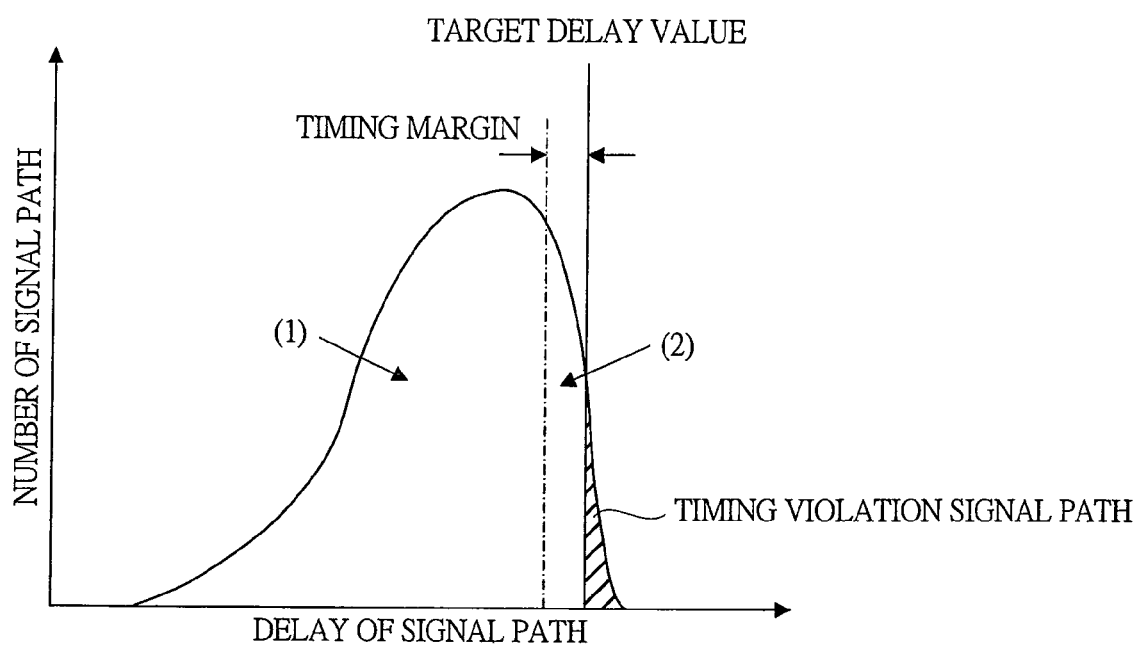

DELAY ADJUSTING METHOD AND LSI THAT USES AIR-GAP WIRING

CROSS-REFERENCE TO RELATED APPLICATION

The present application claims priority from Japanese Patent Application No. JP 2007-270820 filed on Oct. 18, 2007, the content of which is hereby incorporated by reference into this application.

TECHNICAL FIELD OF THE INVENTION

The present invention relates to a manufacturing method of a semiconductor integrated circuit device. More particularly, the present invention relates to an optimization technology of the semiconductor integrated circuit device for complying with design constraints of delay time.

BACKGROUND OF THE INVENTION

Timing optimization is carried out here and there in the design process of semiconductor integrated circuit devices. Conventionally, corrections at RTL (Resistor-Transistor Level), addition of a logic cell, and replacement of a logic cell etc. have been performed. Addition and replacement of logic cells aims to adjust a speed of charging and discharging of a load by size changes of a transistor or by threshold switching of the transistor. For this reason, there has been a problem that the designing period is increased because back tracking of designs such as a logic re-synthesis or a function re-verification is posed when such correction is made.

Japanese Patent Application Laid-Open Publication No. 2003-338546 (Patent Document 1) discloses a method for dissolving a delay violation by means of narrowing or widening a distance between adjacent wirings (conventional art 1), or partly changing a material of an insulating film between adjacent wirings (conventional art 2) to solve such problems, aiming at changing a parasitic capacitance between adjacent wirings in a timing adjustment of a semiconductor integrated circuit device.

On the other hand, as the generation of the process of the semiconductor integrated circuit device progresses, an operation speed of a transistor increases, and at the same time a width of a wiring that connects transistors becomes narrower, and the distance between adjacent wirings becomes closer. The speed of the semiconductor integrated circuit device (LSI) has become to be, in larger percentage, rate-controlled by an RC delay of the wiring rather than a gate delay. To reduce wiring resistance, an aspect ratio (aspect ratio of a cross section) of wiring structure is taken by rectangle being long to the height direction, and thus parasitic capacitance between adjacent wirings is increased, and there is posed further increase of wiring RC delay.

According to the fact, various technologies for reducing the wiring delay have been proposed regarding a road map of a semiconductor device. One of them is parasitic capacitance reduction between wirings by means of development of lower dielectric constant (low-k) materials for an insulating film between wiring layers. In recent years, the progress of low dielectric constant has also being saturated, and although attention has been paid to the insulating film between wiring layers formed of a porous low-k material which is the insulating film obtained by applying porosity to the low-k interlayer insulation film in the next generation, a problem of reliability has remained from insufficient mechanical strength of the materials.

Consequently, an attention is paid to a technology called Air-Gap which leaves a void between adjacent wirings of the same layer as a next-generation wiring structure. Note that, this Air-Gap technology is disclosed in Japanese Patent Application Laid-Open Publication No. 2003-297918 (Patent Document 2).

SUMMARY OF THE INVENTION

In the Air-Gap technology, a void (Air-Gap) is formed between adjacent wirings close to each other within a specified. For this reason, in the case where the Air-Gap technology is applied to the above-mentioned conventional art 1, when the distance between adjacent wirings is made larger than the specified spacing, no void (Air-Gap) will come to exist there, and a problem arises that a parasitic capacitance between adjacent wirings will be increased conversely unlike the conventional art 1. Delay adjustment by means of a wiring load of the above-mentioned conventional art 1 in a range within the specified wiring spacing in which the void (Air-Gap) is formed, since a wiring pitch dependability becomes extremely small, redrawing of wirings is required over the longer wiring length, and gives rise to the problem of wasting wiring channels.

Further, since the above-mentioned conventional art 2 is a technology to add a new special insulating material in addition to an insulating material used usually to the insulating film between wiring layers, a manufacturing process becomes complicated, and additional equipment is needed to be secured to an existing manufacturing line, and an application of new materials will give rise to a problem that cost and TAT are increased including a securement of reliability.

The present invention has been made to dissolve the above-mentioned conventional problems. An object of the present invention is, on the premise of an application of the Air-Gap technology, to provide a method for manufacturing a semiconductor integrated circuit device capable of timing optimization with suppressing additions to the manufacturing process and without increase in cost and TAT.

The typical ones of the inventions disclosed in this application will be briefly described as follows.

A manufacturing method of a semiconductor integrated circuit device of the present invention comprises the steps of: a first step for performing a circuit design; a second step for performing a layout design based on information of the circuit design; a third step for manufacturing a semiconductor integrated circuit device based on information of the layout design, where, in the second step, an existence of a timing constraint violation is determined, and in the case where a timing constraint violation is detected, a void formation inhibition zone is set up in part or whole of a spacing (inter-wiring spacing) between an optimization-target wiring requiring a further delay of a signal and a clock and an adjacent wiring spacing being adjacent to the optimization-target wiring within a specified spacing to dissolve the timing constraint violation, and in the third step, an insulating film is formed in a spacing (inter-wiring spacing) between the adjacent wiring and the optimization-target wiring in the void formation inhibition zone, and a void is formed in a spacing (inter-wiring spacing) between the adjacent wiring and the optimization-target wiring outside the void formation inhibition zone.

According to the present invention, it is possible to provide a semiconductor integrated circuit device capable of timing optimization with suppressing additions to a manufacturing process and without increase in cost and TAT, and a method of manufacturing the same.

BRIEF DESCRIPTIONS OF THE DRAWINGS

FIG. 2 is a timing pass delay distribution map computed by a timing constraint violation determination step V03;

DESCRIPTIONS OF THE PREFERRED EMBODIMENTS

Hereinafter, embodiments of the present invention will be described in detail with reference to the accompanying drawings. Note that, components having the same function are denoted by the same reference symbols throughout the drawings for describing the embodiment, and the repetitive description thereof will be omitted.

Figure 1:
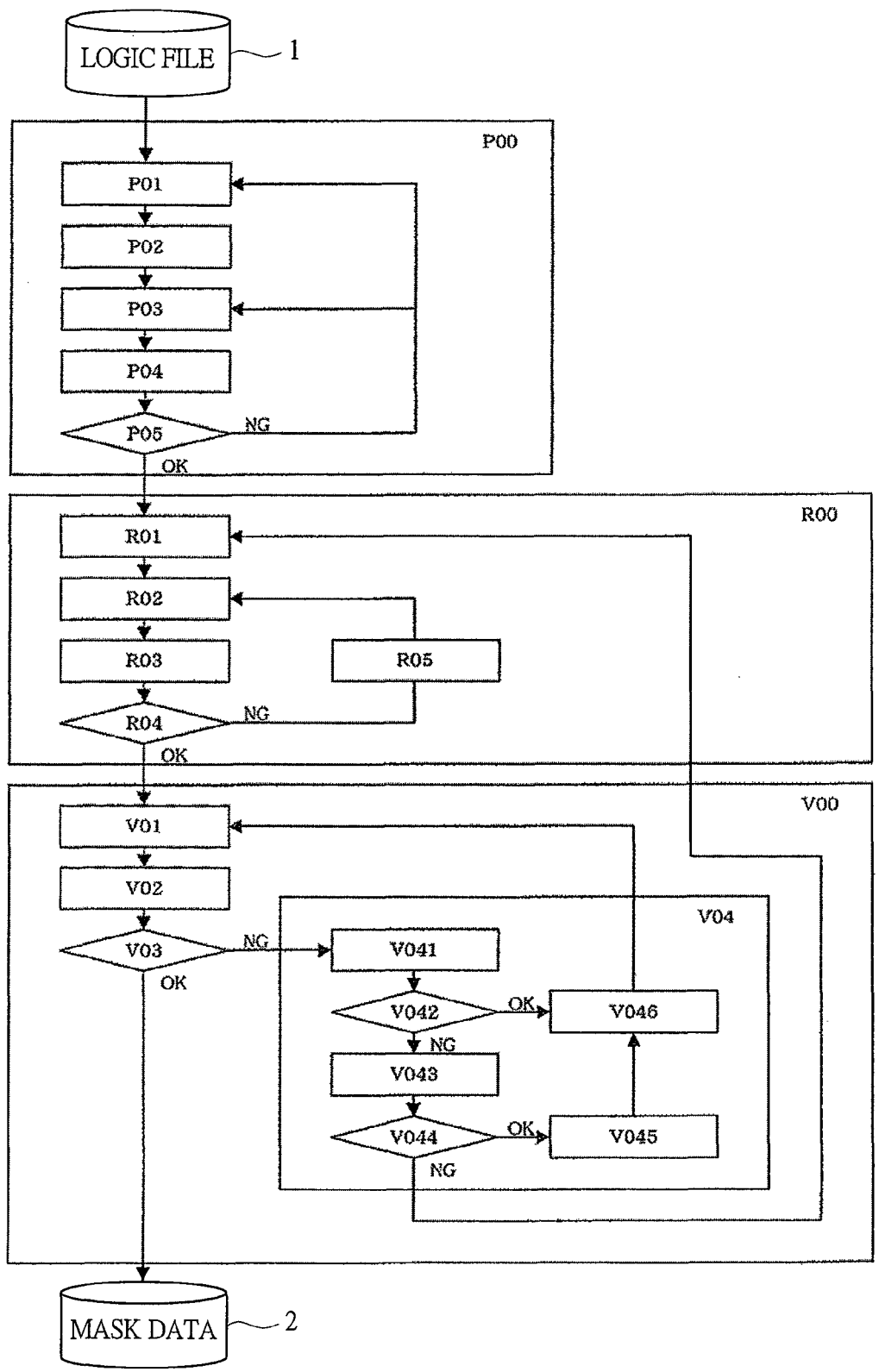
FIG. 1 is a flowchart of a layout design stage according to an embodiment of the present invention.

FIG. 1 is a flowchart of a layout design level in a manufacturing method of a semiconductor integrated circuit device according to an embodiment of the present invention. A circuit design is performed in advance of the layout design, and the circuit design information is stored in a logic file 1.

The layout design includes a placing step P00 for determining a position arrangement of a logic block, a flip-flop, a buffer, etc., a routing step R00 for determining a layout of wiring, and a verification step V00 for confirming a final operation speed.

The placing step P00 includes: a cell placing step P01 for arranging a logic cell (a logic block and a flip-flop) based on the circuit design information; a fan-out adjustment step P02 for inserting a buffer automatically according to the logic cell position information; a simplified routing step P03 for routing wirings between respective terminals of the logic block, the flip-flop, and the buffer; a delay time calculation step P04 for computing a signal delay time of a signal wiring among the wirings which already have been routed; and a delay time checking step P05 for verifying whether the signal delay time between logic cells falls within a specified time based on a result of the delay time calculation step P04. The simplified routing step P03 is a step for performing a temporary wiring for deciding whether the disposition of the logic block, the flip-flop, and the buffer, etc. is proper or not, and actual routing is performed in the following routing step R00.

In the case where the signal wiring in which signal delay time does not fall within the specified time in the delay time checking step P05 is extracted, the step returns to the cell placing step P01, and the steps from P01 to P04 are carried out repeatedly until all the signal delay time falls within the specified time in the delay time checking step P05. When all the signal delay times are fitted in the specified time, the step will be shifted to the following routing step R00, with taking the disposition information of the logic block, the flip-flop, and the buffer determined on that occasion in the cell placing step P01 and the fan-out adjustment step as a final one.

Routing step R00 includes: an automatic routing step R01 for performing remaining wiring routings after wiring after wiring a critical path and a clock, etc. by priority based on the disposition information determined at the placing step P00; a signal integrity checking step R02 for performing checking of a parallel wiring length and a waveform; a delay time calculation step R03 for computing each delay time based on each wiring length of the signal wirings and the clock wirings; a timing constraint violation determination step R04 for determining an existence of a timing constraint violation based on the signal delay time and the clock delay time which have been obtained by the delay time calculation step R03, and a wiring correction step R05 for correcting the wiring length of the signal wiring or the clock wiring to dissolve the timing constraint violation when it has been extracted by the timing constraint violation determination step R04.

In the wiring correction step R05, in the case where a determination of a hold delay violation is done at the timing constraint violation determination step R04, a correction for further lengthening the wiring length of the signal wiring in violation is carried out. In the case where a determination of a setup delay violation is made at the timing constraint violation determination step R04, it is performed any of a correction for further shortening the wiring length of the signal wiring in violation or a correction for lengthening the wiring length of the clock wiring in violation. When no timing constraint violation exists in all the signal wiring and clock wiring, the step will be shifted to the following verification step V00.

The hold delay violation is an error by which a data signal propagates faster than the clock signal change and the time required for latching the data properly can not be secured enough, and a setup delay violation is an error by which enough time for retaining the data before the clock signal change is not secured.

The verification step V00 includes: a wiring RC extraction step V01 for extracting details about a parasitic resistance and a parasitic capacitance of each wiring based on the wiring information determined in the routing step R00; a delay time calculation step V02 for computing each delay time based on the parasitic resistance and parasitic capacitance of each wiring, and each wiring length thereof, which are obtained in the wiring RC extraction step V01; a timing constraint violation determination step V03 for determining existence of a timing constraint violation based on the signal delay time and the clock delay time which are obtained at the delay time calculation step R03; and a timing optimization step V04 for dissolving the timing constraint violation when a timing constraint violation is detected in the timing constraint violation determination step V03. In the timing constraint violation determination step V03, detected are not only existence of the hold delay violation and setup delay violation but also an equal skew violation in the distribution of the clock signal, etc.

A first feature of the present invention is to set up a zone where formation of a void is inhibited among the spaces between adjacent wirings being close to each other within the specified wiring spacing in which the void (Air-Gap) is formed by application of the Air-Gap technology in the timing optimization step V04. The manufacturing process of the semiconductor integrated circuit device for the void formation inhibition will be described concretely later, and the timing optimization step V04 will be first described in detail.

In the timing optimization step V04, based on an additional delay time of a signal and clock required for dissolution of the violation detected at the timing constraint violation determination step V03, and a delay time increased by increasing parasitic capacitance by eliminating the void, length "L" of the zone where the formation of the void should be inhibited is computed (step V041).

Next, based on the wiring information determined at the routing step R00, the wiring which needs an additional delay time of the signal and clock (referred to "optimization-target wiring" hereafter) and the adjacent wirings being adjacent to each other within the specified wiring spacing in which the void is formed on the contrary to the optimization-target wiring are specified, and thereafter, it is determined whether an adjacent wiring length "l" is larger than the length L of the void formation inhibition zone computed at the step V041 (step V042). Adjacent wiring length l is the length of the portion where adjacent wirings exist in parallel and along with the optimization-target wiring within the specified wiring spacing. In the case where a plurality of adjacent wirings exist with respect to the optimization-target wiring, let the lengths of those are summed to be the adjacent wiring length l. FIG. 2 shows a timing pass delay distribution map computed in the timing constraint violation determination step V03. When specifying an adjacent wiring of the optimization-target wiring in the above-mentioned step V042, excluding the timing violating path and the adjacent wiring with respect to the pass in zone (2) in FIG. 2, specified is only adjacent wirings with respect to the paths within the zone (1) where the path delay shown in FIG. 2 has more margins than the timing margin with respect to the target delay value.

In the step V042, in the case where it is determined that the adjacent wiring exists and the length l is larger than the length L of the void formation inhibition zone, the void formation inhibition zone corresponding to the length L is set up between the optimization-target wiring and the adjacent wiring (step V046).

Figure 3A:
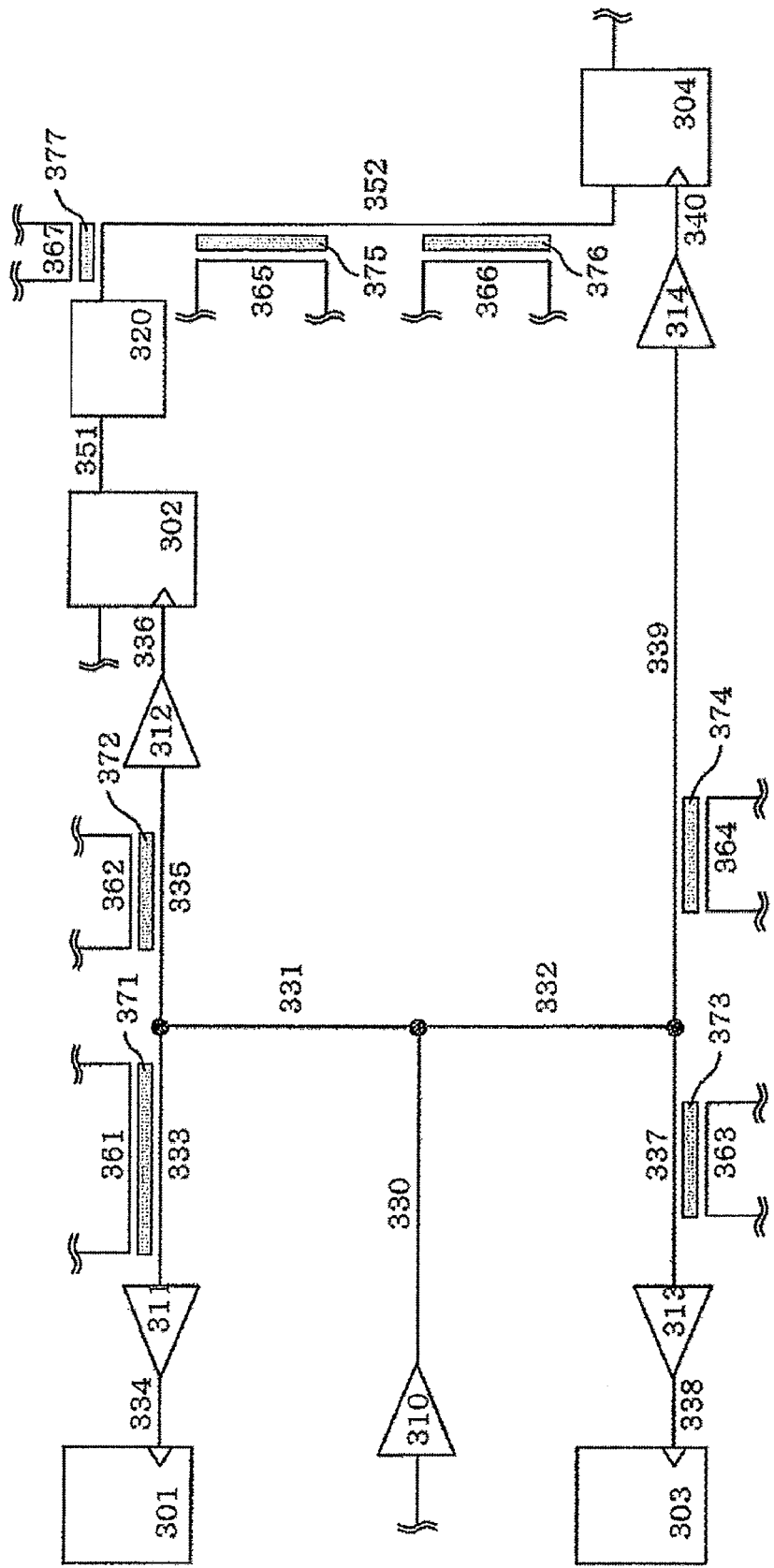
FIG. 3A is a layout chart of a logic block, a flip-flop, a buffer and various wiring before a step V00.

FIG. 3A shows a layout chart according to an example where the logic block, the flip-flop, and the buffer are disposed in the placing step P00, and where the wirings between respective terminals are made in the routing step R00. 301 to 304 indicate the flip-flops, 310 to 314 indicate the buffers, 320 indicates the logic block, 330 to 340 indicate the clock wirings, 351 to 352 indicate the signal wirings, 361 to 364 indicate the adjacent wirings adjacent to the clock wirings 333, 335, 337, 339 within the specified wiring spacing where the voids 371, 372, 373, 374 are formed, respectively, and 365, 366, 367 indicate the adjacent wirings adjacent to the signal wiring 352 within the specified wiring spacing where the voids 375, 376, 377 are formed, respectively.

Figure 3B:
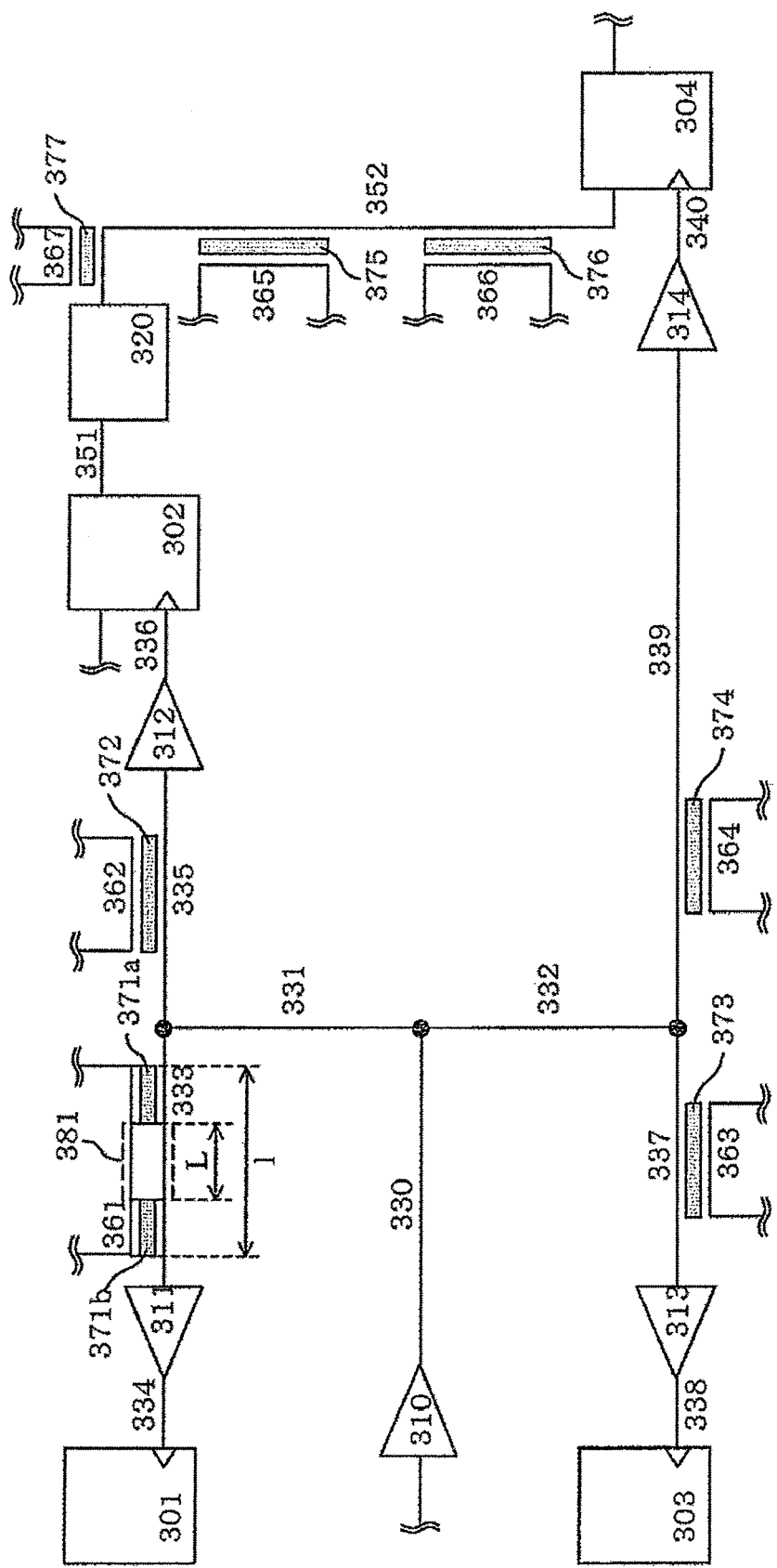
FIG. 3B is a layout chart after timing optimization of an equal skew violation in a step V04.

FIG. 3B shows a layout chart after the timing optimization step V04 in the case where the propagation delay time of the clock to the flip flop 301 is shorter than the propagation delay time of the clock to other flip-flops 302 to 304 in the layout of FIG. 3A, and the equal skew violation of the clock signal is detected in the timing constraint violation determination step V03.

In the case where the above-mentioned equal skew violation occurs in with the layout of FIG. 3A is raised, the clock wirings 333 and 334 become the above-mentioned optimization-target wirings. Among these, as for the optimization-target wiring 334, there is no adjacent wiring for the void to be formed therebetween and as for the optimization-target wiring 333, there exists one adjacent wiring 361 for the void 371 to be formed therebetween. Here, the adjacent wiring 361 is assumed to be the adjacent wiring relating to the above-mentioned paths in the zone (1) of FIG. 2.

FIG. 3B shows a state where, in the step V042, the length l of the adjacent wiring 361 is determined as being larger than the length L of the void formation inhibition zone computed in the step V041 and a void formation inhibition zone 381 corresponding to the length L is set up between the optimization-target wiring 333 and the adjacent wiring 361 in the step V046. In FIG. 3B, voids 371a and 371b are formed in both ends, respectively, and the void formation inhibition zone 381 is made to be positioned therebetween, but it may be possible to form one void on one end side and to form the void formation inhibition zone on the other end side. However, in the actual manufacturing process of the semiconductor device, the layout shown in FIG. 3B is more advantageous in the point that the additional delay time as designed by the layout design can be given, because the variation of length L of the void formation inhibition zone 381 does not arise even in the case where there occurs an alignment error along the extending direction of the optimization-target wiring 333 of the mask defining the void formation inhibition zone 381.

Figure 3C:
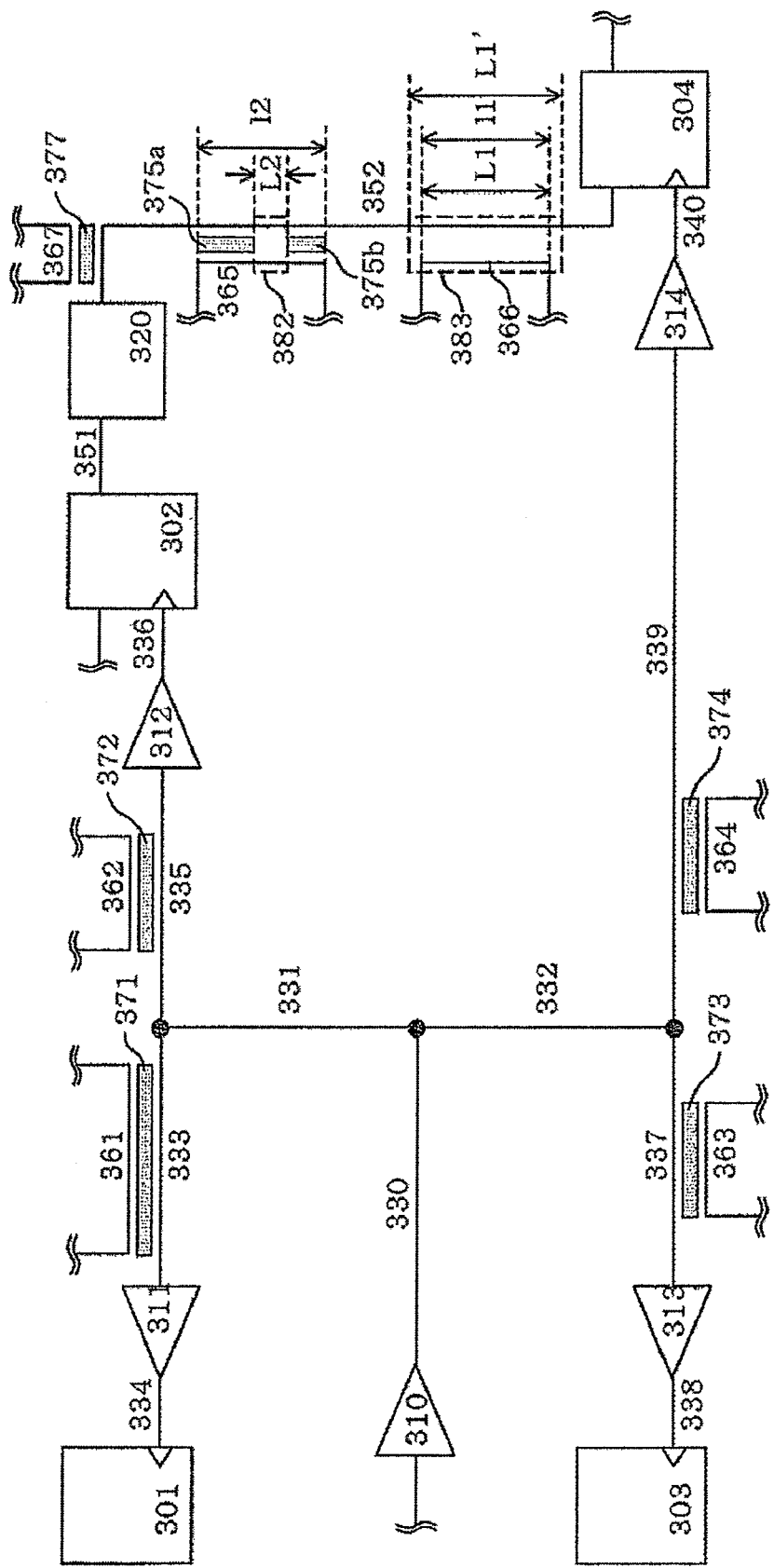
FIG. 3C is a layout chart after timing optimization of a hold delay violation in the step V04.

Next, FIG. 3C shows a layout chart after timing optimization step V04 in the case that, in the timing constraint violation determination step V03, detected is the hold delay violation in which the propagation delay time of the signal to the flip-flop 304 is shorter than the propagation delay time of the clock to flip-flop 304, data from the logic block 320 are not correctly transferred to flip-flop 304 by one time the clock edge, and the data passes through flip-flop 304 in the layout of FIG. 3A.

In the case where the above-mentioned hold delay violation arises in the layout of FIG. 3A, the signal wirings 351 and 352 become the above-mentioned optimization-target wirings. Among these, as for the optimization-target wiring 351, there is no adjacent wiring for the void to be formed therebetween and as for the optimization-target wiring 352, there exist three adjacent wirings 365, 366 and 367 for the void 375, 376 and 377 to be formed therebetween, respectively. In the following description, it is assumed that, among the adjacent wirings 365 to 367, the adjacent wiring 367 is the adjacent wiring with respect to the paths in the zone (2) mentioned above of FIG. 2, and the adjacent wirings 365 and 366 are the adjacent wirings with respect to the paths in the zone (1) of FIG. 2 mentioned above.

FIG. 3C shows a state where it is determined, in the step V042, that the length l (l1+l2) which is a sum of a length l2 of the adjacent wiring 365 and a length l1 of the adjacent wiring 366 excluding the adjacent wiring 367 is longer than the length L of the void formation inhibition zone computed in the step V041 and where a void formation inhibition zone 382 and a void formation inhibition zone 383 are set up respectively in the step V046 between the optimization-target wiring 352 and the adjacent wiring 365 and between the optimization-target wiring 352 and the adjacent wiring 366. In FIG. 3C, the length L(L1+L2) of the void formation inhibition zone computed in the step V041 is divided into a length L1 equal to the length l1 of the adjacent wiring 366 and a remaining length L2, and all the zone between the optimization-target wiring 352 and the adjacent wiring 366 is made to be the void formation inhibition zone 383, and the void formation inhibition zone 382 corresponding to the length L2 is set up between the optimization-target wiring 352 and the adjacent wiring 365. Here, in the setting of the void formation inhibition zone 383, it is advantageous to make the length longer than the length l1 of the adjacent wiring 366 like L1' in FIG. 3C. In the case where the length of the void formation inhibition zone 383 is made to be the length L1 which is exactly equal to the length l1 of the adjacent wiring 366, if there arises an alignment error of the extending direction of the optimization-target wiring 352 of the mask defining the void formation inhibition zone 383 in the actual manufacturing process of the semiconductor device, a void will be formed in one end part, and there is a possibility that it may become impossible to give an additional delay time as designed by the layout design. Such a problem can be prevented by performing a somewhat long setting like L1' in FIG. 3C. When FIG. 3A is compared with FIG. 3C, it is clear that the substantial length of the void formation inhibition zone is L1 equal to the length l1 of the adjacent wiring 366 even if a somewhat long setting is performed for the void formation inhibition zone 383 like L1' in FIG. 3C. An effect by means of having voids 375a and 375b arranged on both sides of the void formation inhibition zone 382 respectively is as that mentioned above in FIG. 3B.

Figure 3D:
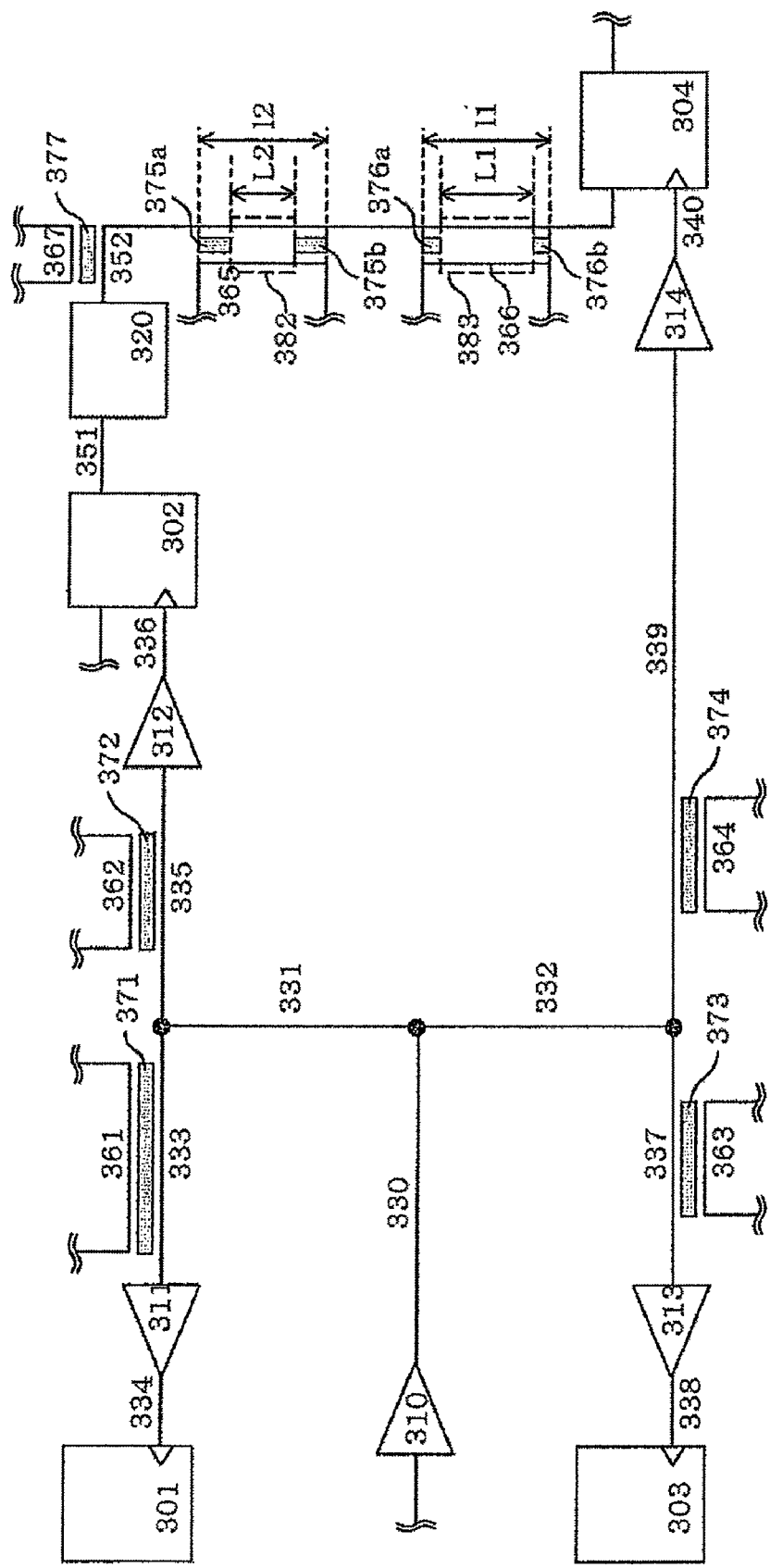
FIG. 3D is another layout chart after timing optimization of a hold delay violation in the step V04.

FIG. 3D shows a modification example of the layout of the void formation inhibition zone 382 and the void formation inhibition zone 383 in FIG. 3C. In FIG. 3D, the length L1 of the void formation inhibition zone 383 is made to be shorter than the length l1 of the adjacent wiring 366 without changing the length L of the sum of L1 and L2, proportionately, the length L2 of the void formation inhibition zone 382 is made longer than the length L2 of the void formation inhibition zone 382 in FIG. 3C, and the voids 376a and 376b are layouted also on both sides of the void formation inhibition zone 383, respectively.

In the case where it is determined that the length l of the adjacent wiring is less than the length L of the void formation inhibition zone in the step V042, calculated is the delay time of shortage acquired by subtracting the delay time obtained by eliminating all voids between the optimization-target wiring and the adjacent wiring in the above-mentioned zone (1) of FIG. 2 from the additional delay time of the signal and clock required for the dissolution of the violation detected in the timing constraint violation determination step V03, and calculated is the delay time which is increased by forming a dummy wiring adjacent to the optimization-target wiring to increase the parasitic capacitance, and based on these calculations above, a length "m" of a dummy wiring to be formed (step V043). In such calculation, although the space between the optimization-target wiring and the dummy wiring is made to be smaller or equal to the specified wiring spacing where the void is formed, the void formation inhibition zone shall be set up between the optimization-target wiring and the dummy wiring and the void shall not be formed there at all.

Next, it is determined whether the area where the dummy wiring having the length m computed in the step V043 is formed exists in the surroundings of the optimization-target wiring (step V044).

In the step V044, in the case where it is determined that the area where the dummy wiring of length m is formed exists, the dummy wiring having the length m adjacent to the optimization-target wiring is set up (step V045).

Next, in order that all of the void between the optimization-target wiring and the adjacent wiring and the void between the optimization-target wiring and the dummy wiring may be eliminated, a void formation inhibition zone having the length l is set up between the optimization-target wiring and the adjacent wiring, and the void formation inhibition zone having the length m is set up between the optimization-target wiring and the dummy wiring, respectively (step V046).

Figure 3E:
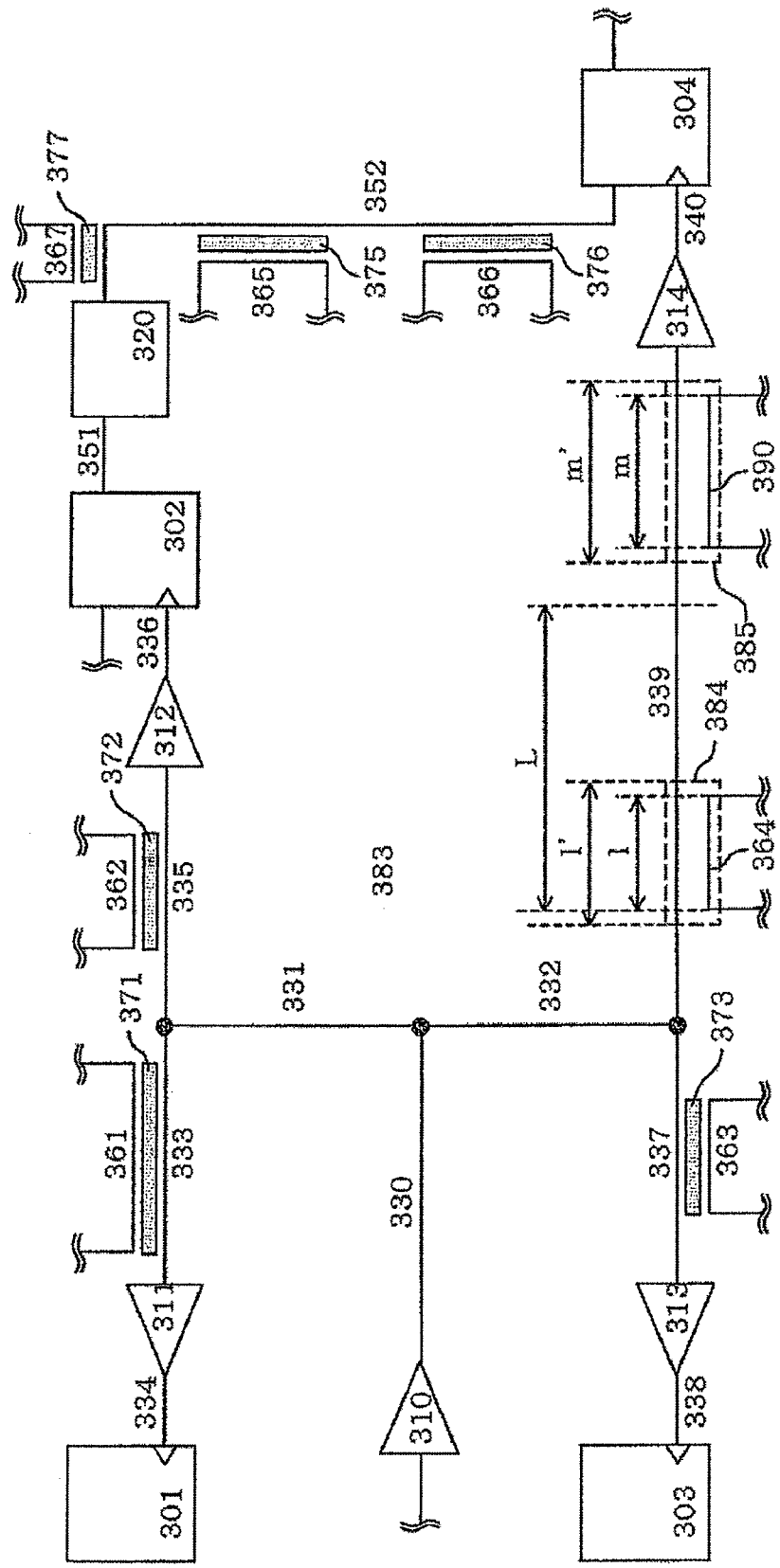
FIG. 3E is a layout chart after timing optimization of a setup delay violation in the step V04.

FIG. 3E shows a layout chart after the timing optimization step V04 in the case where the propagation delay time of the signal to flip-flop 304 is longer than a sum of the propagation delay time of the clock to the flip-flop 304 and the clock period in the layout of FIG. 3A, and in the timing constraint violation determination step V03, detected is the setup delay violation in which data transfer from the logic block 320 to the flip-flop 304 is not performed in time within the target clock cycle.

In the case where the layout of FIG. 3A causes the above-mentioned setup delay violation, the clock wirings 339 and 340 become the optimization-target wiring mentioned above. Among these, as for the optimization-target wiring 340, there is no adjacent wiring for the void to be formed therebetween and as for the optimization-target wiring 339, there exists one adjacent wiring 364 for the void 374 to be formed therebetween. Here, the adjacent wiring 364 is assumed to be the adjacent wiring with respect to the paths in the above-mentioned zone (1) in FIG. 2.

FIG. 3E shows a state where it is determined in the step V042 that the length l of the adjacent wiring 364 is smaller than the length L of the void formation inhibition zone computed in the step V041, and in the step V044, it is determined that an area in which the dummy wiring is formed having the length m computed in the step V043 exists around the optimization-target wiring 339, and in the step V045, the dummy wiring 390 having the length m adjacent to the optimization-target wiring 339 is arranged, and at the same time, in the step V046, the void formation inhibition zone 384 having the length l of the adjacent wiring 364 and the void formation inhibition zone 385 having the length m of the dummy wiring 390 are set up between the optimization-target wiring 339 and the adjacent wiring 364, and between the optimization-target wiring 339 and the dummy wiring 390, respectively. Here, in the setting of void formation inhibition zone 384, by making the length of the void formation inhabitation zone 384 longer than the length l of the adjacent wiring 364 like l' in FIG. 3E, and in the setting of the void formation inhibition zone 385, by making the length of the void formation inhibition zone 385 longer than the length m of the dummy wiring 390 like m' in FIG. 3E, as described in FIG. 3C, the additional delay time as designed by the layout design can be given surely.

In the step V044, in the case where it is determined that the area in which the dummy wiring having the length m computed at the step V043 around the optimization-target wiring does not exist, returning to the automatic routing step R01 of the routing step R00, the rerouting of the optimization-target wiring is performed without performing the timing optimization in the step V04.

After the timing optimization in the step V04 is performed, returning to the wiring RC extraction step V01, the step goes to the timing constraint violation determination step V03 through the delay time calculation step V02. When the timing constraint violation is no longer detected in the timing constraint violation determination step V03 and the timing constraint violation is not found in all the signal wirings and clock wirings, the position information determined at the placing step P00, wiring information determined in the routing step R00, and besides, the setup information of the void formation inhibition zone or the dummy wiring in the timing optimization step V04 are stored as a mask data 2, and the step is shifted to the manufacturing process of the semiconductor integrated circuit device.

A manufacturing process of the semiconductor integrated circuit device to which the Air-Gap technology is adapted and does not have the void formed in the void formation inhibition zone set up in the above-mentioned step V046 will be described. In the present invention, since the formation process of a semiconductor device such as a MOSFET on a semiconductor substrate is the same as a conventional process, a formation process of wiring layers after a semiconductor device formation which is the characteristic of the present invention will be described in detail.

Figure 4:
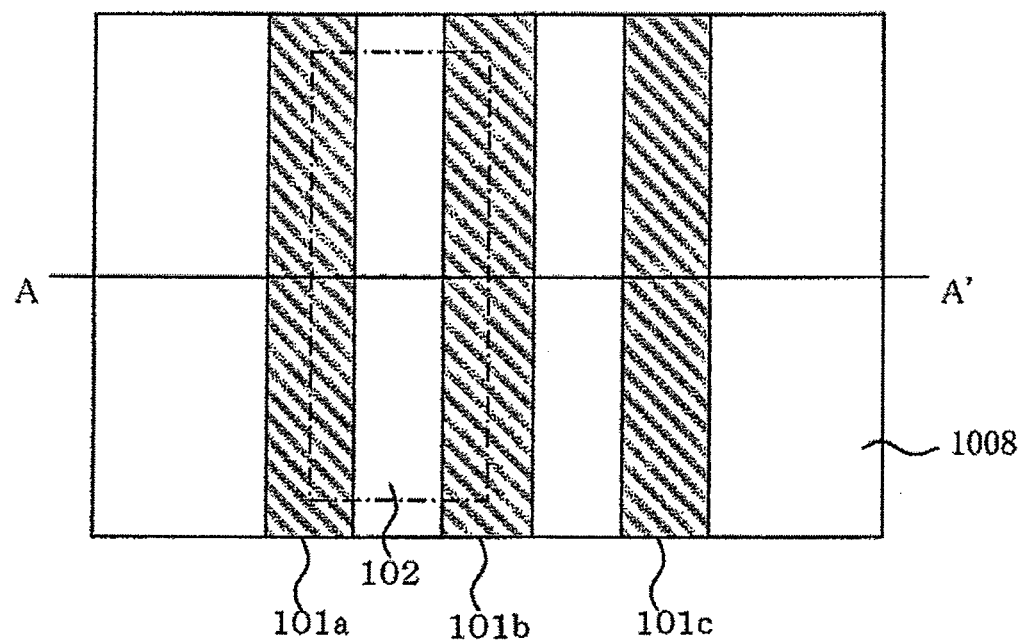
FIG. 4 is a plan view showing main parts of a semiconductor integrated circuit device according to the embodiment of the present invention.
Figure 5:
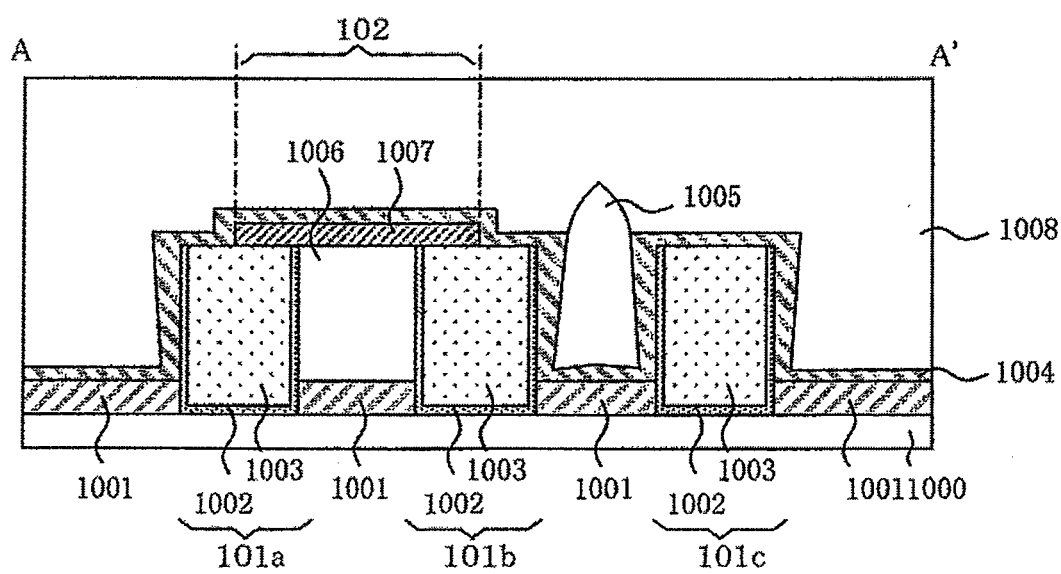
FIG. 5 is a plan view showing main parts of the semiconductor integrated circuit device according to the embodiment of the present invention.

FIG. 4 shows a plan view of main parts of the wiring layer of the semiconductor integrated circuit device according to an embodiment of the present invention, and FIG. 5 is a cross-sectional view along the line A-A' of FIG. 4. In each figure, 101a to 101c are the wirings and 102 is a void formation inhibition zone, 1002 is a conductive barrier film (a first conductor film), 1003 is a main conductor film (a second conductor film), 1005 is a void (Air-Gap), and 1000, 1001, 1004, 1006 to 1008 are insulating films. As shown in FIG. 4 and FIG. 5, the void 105 is formed between the wiring 101b and the wiring 101c, and the insulating film 1006 exists between the wiring 101a and the wiring 101b in the void formation inhibition zone 102, and thus the void is not formed therein.

Note that, in the example shown in above-mentioned FIG. 3B, the clock wiring 333 and the adjacent wiring 361 correspond to the wiring 101b and the wiring 101a of FIG. 4 and FIG. 5, respectively, and, the clock wirings 335, 337, 339 and the adjacent wirings 362 to 364, alternatively, the signal wiring 352 and the adjacent wirings 365 to 367 correspond to the wiring 101b and the wiring 101C in FIG. 4 and FIG. 5, respectively. In the example shown in above-mentioned FIG. 3C and FIG. 3D, the signal wiring 352 and the adjacent wiring 365, or the signal wiring 352 and the adjacent wiring 366 correspond to the wiring 101b and the wiring 101a of FIG. 4 and FIG. 5, respectively; and the clock wirings 333, 335, 337, and 339 and the adjacent wirings 361 to 364, alternatively, the signal wiring 352 and the adjacent wiring 367 correspond to the wiring 101b and the wiring 101c in FIG. 4 and FIG. 5, respectively. Further, in the example shown in above-mentioned FIG. 3E, the clock wiring 339 and the adjacent wiring 364, alternatively, the clock wiring 339 and the dummy wiring 390 correspond to the wiring 101b and the wiring 101a of FIG. 4 and FIG. 5, respectively; and the clock wirings 333, 335, 337 and the adjacent wirings 361 to 363, alternatively, the signal wiring 352 and the adjacent wirings 365 to 367 correspond to the wiring 101b and the wiring 101c in FIG. 4 and FIG. 5, respectively.

Figure 6:
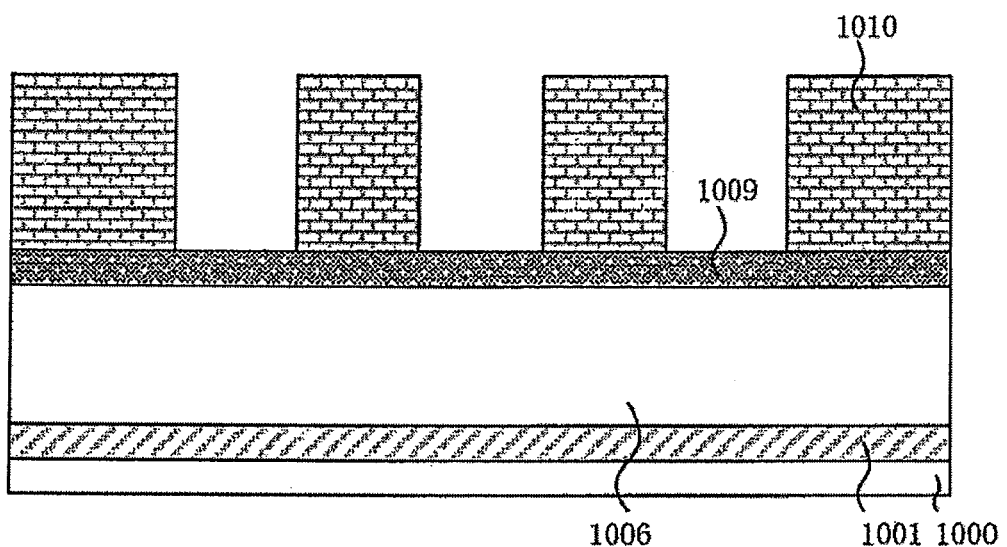
FIG. 6 is a plan view showing main parts of the semiconductor integrated circuit device in a manufacturing process of wiring layers according to the embodiment of the present invention.

FIGS. 6 to 12 are cross-sectional views of main parts of the semiconductor integrated circuit in the manufacturing process of the wiring layer of the semiconductor integrated circuit device according to the embodiment of the present invention. First, as shown in FIG. 6, the insulating film 1001 is formed by a plasma CVD method etc. on the insulating film 1000. Although not illustrated, under the insulating film 1000, the semiconductor substrate of the semiconductor integrated circuit device and the semiconductor device formed thereon have been already formed. The insulating film 1001 comprises a silicon nitride film formed by, for example, a plasma CVD method, and a thickness thereof is about 25 nm to 50 nm, for example. As other materials of the insulating film 1001, for example, a silicon carbide film formed with a plasma CVD method, a SiCN film formed with a plasma CVD method, or a single substance film of a silicon oxynitride (SiON) film formed with a plasma CVD method, may be used. In the case where these films are used, since a dielectric constant can be largely lowered compared with a silicon nitride film, and thus a wiring capacitance can be reduced and the operation speed of the semiconductor device can be improved. As for the silicon carbide films formed with a plasma CVD method, there is the above-mentioned BLOk (manufactured by AMAT), for example. When forming a SiCN film, a mixed gas of helium (He), ammonia ($NH_3$), and trimethylsilane (3MS) is used, for example. As an silicon oxynitride film formed with a plasma CVD method, there is PE-TMS (manufactured by Canon, dielectric constant=3.9), for example, and a mixed gas of trimethoxysilane (TMS) gas and nitric oxide ($N_2O$) gas is used on the occasion of the formation of the silicon oxynitride film, for example.

Next, the insulating film 1006 is formed on the insulating film 1001. Although a film of a low dielectric constant materials (Low-K insulating film) like a Low-K material, for example, a SiOF film, and a SiOC film can also be used for the insulating film 1006, in order to make the additional delay time easy to be given to the optimization-target wiring in the above-mentioned timing optimization, it is more preferred to use a silicon oxide film and a silicon nitride film having a higher dielectric constant.

Figure 7:
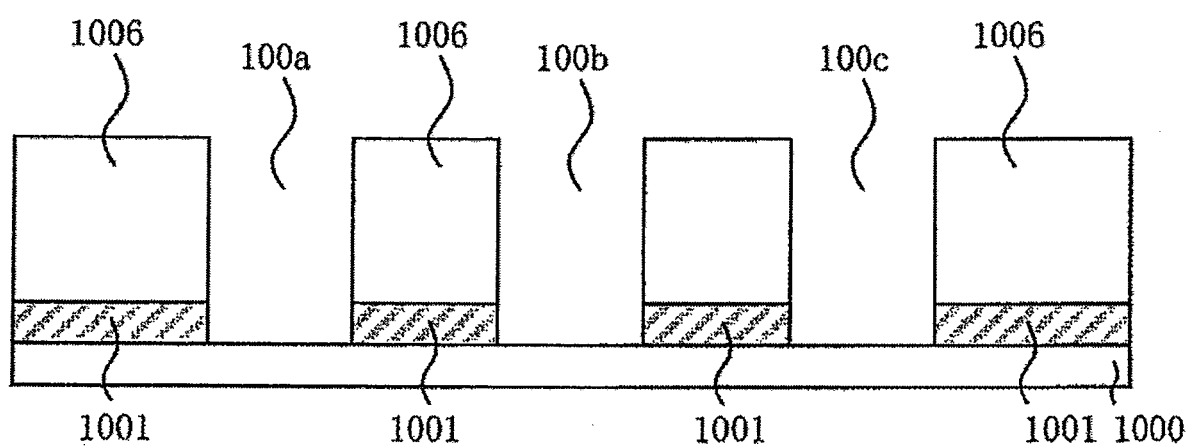
FIG. 7 is a plan view showing main parts of the semiconductor integrated circuit device in the manufacturing process of wiring layers according to the embodiment of the present invention.

Next, an antireflection film 1009 and a photo-resist film are formed in order on the insulating film 1006, the photo-resist film is patterned by exposure, so that a photo-resist pattern 1010 is formed. In the photo-resist pattern 1010, an opening is formed in the formation area of the wiring or the dummy wiring based on the wiring information determined in the above-mentioned routing step R00 and the dummy wiring information set up in the above-mentioned step V045. And the antireflection film 1009 is selectively removed by a dry etching method using the photo-resist pattern 1010 as an etching mask. Then, by a dry etching method using the photo-resist pattern 1010 as an etching mask, the insulating film 1006 is removed selectively and an opening is formed. After that, ashing is performed, and after the ashing of the photo-resist pattern 1010 and the antireflection film 1009 to remove them, the insulating film 1001 exposed from the opening of the insulating film 1006 is etched at the last. Therefore, as shown in FIG. 7, each of wiring trenches 100a to 100c is formed. Note that, after removing the insulating films 1006 and 1001 selectively and forming each of the wiring trenches 100a to 100c by a dry etching method using the photo-resist pattern 1010 as an etching mask, the photo-resist pattern 1010 and the antireflection film 1009 may also be removed.

Figure 8:
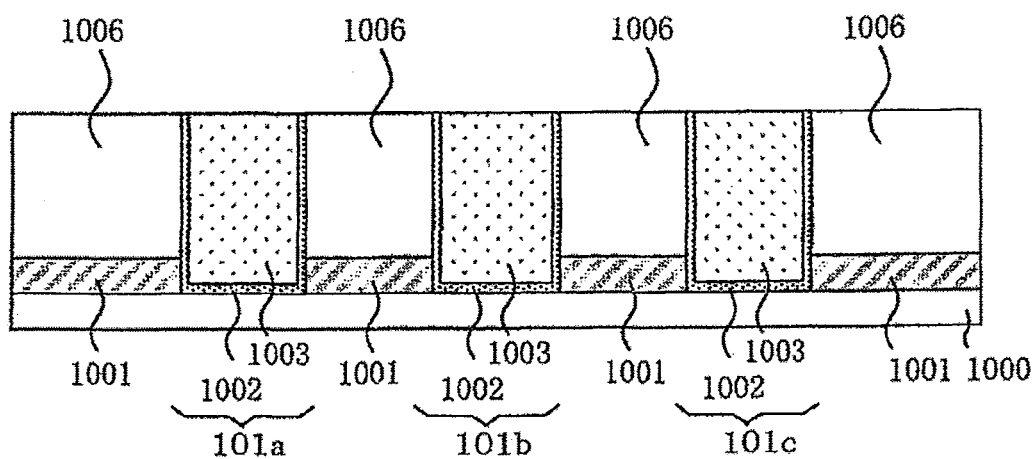
FIG. 8 is a plan view showing main parts of the semiconductor integrated circuit device in the manufacturing process of wiring layers according to the embodiment of the present invention.

Next, as shown in FIG. 8, the thin conductive barrier film (the first conductor film) 1002 with a thickness of about 5 to 50 nm formed of titanium nitride (TiN) etc. is formed on the whole surface using a sputtering process etc. For example, the conductive barrier film 1002 has a function of preventing diffusion of copper for the main conductor film formation to be described later, and a function of improving a copper wettability at the time of reflow of the main conductor film, etc. As the material of such the conductive barrier film 1002, instead of titanium nitride, high melting point metal nitrides which hardly react with copper such as tungsten nitride (WN) or tantalum nitride (TaN) can also be used. As the material of the conductive barrier film 1002, a material including silicon (Si) added to high melting point metal nitride, high melting point metals which cannot react with copper easily such as tantalum (Ta), titanium (Ti), tungsten (W), and a titanium tungsten (TiW) alloy, and a TaN/Ta stacked barrier made by combining TaN with a sufficient adhesion with an insulating film and Ta with a sufficient wettability with Cu, may be used.

Subsequently, the main conductor film (the second conductor film) 1003 which is formed of relatively thick copper about 800 to 1600 nm thick for example, is formed on conductive barrier film 1002. The main conductor film 1003 can be formed by, for example, using a CVD method, a sputtering method, or a plating method. Then, for example, by performing a heat-treatment in a non-oxidizing atmosphere (for example, a hydrogen atmosphere and nitrogen atmosphere) at about 150 to 400° C., reflow of the main conductor film 1003 is made, and copper is buried without spacing to the inner part of the wiring trench 100.

Next, the main conductor film 1003 and the conductive barrier film 1002 are polished by a CMP method. This forms each of the wirings 101a to 101c formed of the relatively thin conductive barrier film 1002 and the relatively thick main conductor film 1003 inside each wiring trench 100a to 100c, respectively, as shown in FIG. 8.

Figure 9:
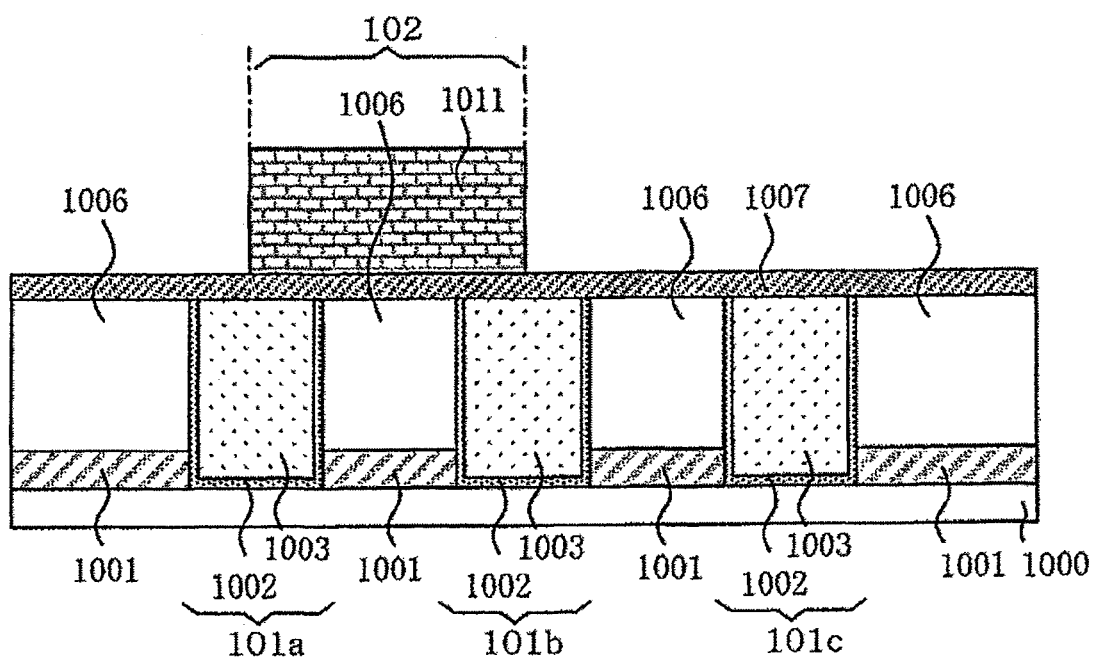
FIG. 9 is a plan view showing main parts of the semiconductor integrated circuit device in the manufacturing process of wiring layers according to the embodiment of the present invention.

Next, as shown in FIG. 9, the barrier insulating film 1007 is formed to 20 to 50 nm on the insulating film 1006 and the wiring 101. The insulating film 1007 is formed of a silicon nitride film, for example, and functions as a barrier insulating film of the copper wiring. Therefore, the insulating film 1007 suppresses or prevents diffusion of copper in the main conductor film 1003 of the wiring 101 in the interlayer insulation film 1008 formed later. As other materials of the insulating film 1007, the single substance film such as a silicon carbide (SiC) film, a carbonitride silicon (SiCN) film, or an silicon oxynitride (SiON) film may be used, for example. Since the dielectric constant can be largely lowered compared with a silicon nitride film when these films are used, the wiring capacitance can be reduced and the operation speed of the semiconductor integrated circuit device can be improved. As the silicon carbide film formed by a plasma CVD method, for example, there is BLOk (manufactured by AMAT). The forming gas is as described above. When forming the above-mentioned SiCN film, the mixed gas of helium (He), ammonia ($NH_3$), and trimethylsilane (3MS) is used, for example. As the above-mentioned silicon oxynitride film formed with a plasma CVD method, there is PE-TMS (manufactured by Canon and dielectric constant=3.9), for example. When forming the above-mentioned silicon oxynitride film, the mixed gas of trimethoxysilane (TMS) gas and nitric oxide ($N_2O$) gas is used, for example. Then, a photo-resist film is formed on the insulating film 1007, and the photo-resist film is patternized by exposure, thereby forming a photo-resist pattern 1011. In this case, the insulating film 1007 functions as a reaction-preventing film of the photo-resist pattern 1011 and the copper wiring 101. In order to improve accuracy, it is also possible to use the antireflection film for the lower part of a photo-resist film and the upper part of the barrier insulating film 1007. Based on the void formation inhibition area information set up at the above-mentioned step V046, this photo-resist pattern 1011 is formed so that the void formation inhibition zone 102 is covered.

Figure 10:
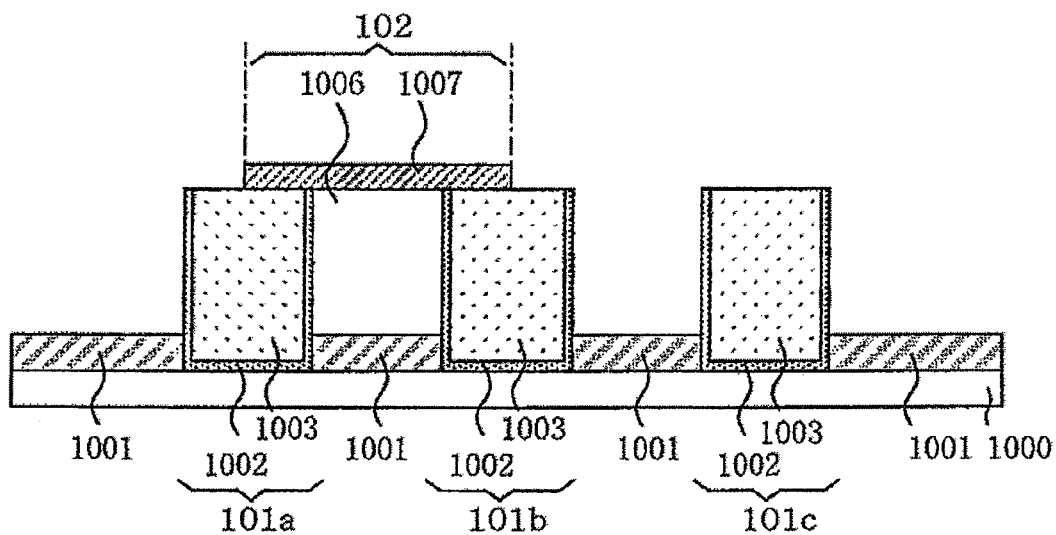
FIG. 10 is a plan view showing main parts of the semiconductor integrated circuit device in the manufacturing process of wiring layers according to the embodiment of the present invention.

And, by a dry etching method using this photo-resist pattern 1011 as an etching mask, the insulating films 1007 and 1006 are removed selectively and the insulating films 1007 and 1006 of the void formation inhibition zone 102 are remained (FIG. 10). In this case, by disposing a wafer in a processing chamber of a plasma CVD device, then introducing $CF_4$ gas, and supplying a plasma power source, with respect to the wafer (CMP surface where particularly the wiring 101 is exposed), $CF_4$ plasma treatment is performed and insulating films 1007 and 1006 are removed. Although an organic-based secondary product and a fluoride-based secondary product are slightly produced temporarily in the Cu wiring surface of 1003 by such $CF_4$ plasma treatment, these are removable with post-cleaning (for example, organic-acid cleaning, fluoric acid cleaning, organic alkali cleaning, or cleaning by means of those mixed solutions) and hydrogen annealing treatment carried out after that. In the case where an organic layer which does not include silicon such as SiLK is used for the insulating film 1006, a reduction plasma, such as ammonia and $N_2/H_2$ mixed gas, is used for etching of the insulating film 1006. Plasma treatment means exposing a substrate surface or the member surface when members such as an insulating film and a metallic film are formed on the substrate, to an environment in the plasma state, and processing by having a chemical and mechanical (bombardment) operation of plasma on the surface. Plasma of the reducing atmosphere means the plasma environment where reacting species of a radical, ion, an atom, a molecule, etc. which have a reduction operation, i.e., an operation which draws out oxygen, exist dominantly.

A second feature of the present invention is, in an insulating film removal step between adjacent wirings indispensable to the following void formation, to remain the insulating film 1006 between adjacent wirings of the void formation inhibition zone 102 set up in the above-mentioned timing optimization step V04 without removing the same.

Figure 11:
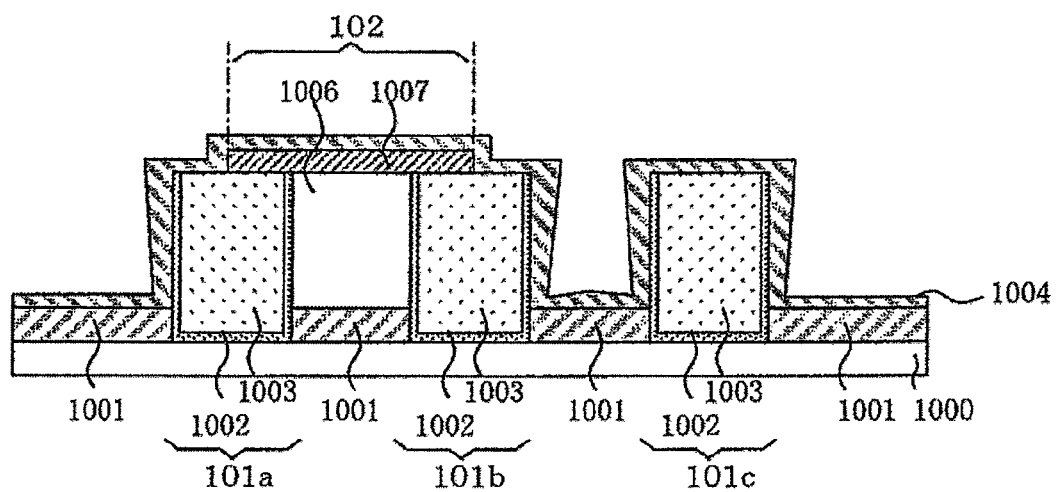
FIG. 11 is a plan view showing main parts of the semiconductor integrated circuit device in the manufacturing process of wiring layers according to the embodiment of the present invention.

FIG. 11 is a cross-sectional view of main parts in the manufacturing process of the wiring layers of the semiconductor integrated circuit device continued from FIG. 10. After the insulating film 1006 other than that of the void formation inhibition zone 102 is removed, a post-cleaning is performed and the insulating film 1004 is formed with s plasma CVD method etc. all over after that. That is, insulating film 1004 of 20 to 50 nm is formed so that the upper surface and side surfaces of each of the wirings 101a to 101c, the barrier insulating film 1007, and the insulating film 1001 are covered. The insulating film 1004 formed of a silicon nitride film, for example, and functions as the barrier insulating film of the copper wiring. Therefore, the insulating film 1004 suppresses or prevents diffusion of copper in the main conductor film 1003 of wiring 101 in the interlayer insulation film 1008 formed later. As other materials of the insulating film 1004, the single substance film of a silicon carbide (SiC) film, a carbonitride silicon (SiCN) film, or an silicon oxynitride (SiON) film may be used, for example. Since the dielectric constant can be largely lowered compared with the silicon nitride film in the case where these films are used, the wiring capacitance can be reduced and the operation speed of the semiconductor device can be improved. As the silicon carbide film formed with plasma CVD method, there is, for example, BLOk (manufactured by AMAT). The forming gas of the same is as described above. When forming the above-mentioned SiCN film, the mixed gas of helium (He), ammonia ($NH_3$), and trimethylsilane (3MS) is used, for example. As the above-mentioned silicon oxynitride film formed with a plasma CVD method, there is PE-TMS (manufactured by Canon and dielectric-constant=3.9), for example. When forming the above-mentioned silicon oxynitride film, the mixed gas of trimethoxysilane (TMS) gas and nitric oxide ($N_2O$) gas is used, for example. Next, the insulating film 1008 is formed on the barrier insulating film 1004. A low dielectric constant insulating film (Low-K insulating film) such as SiOF and SiOC is used for the insulating film 1008.

In the present embodiment, the insulating film 1008 is deposited in the condition that the insulating film 1008 is not formed conformally between the wiring 101b and the wiring 101c which are close to each other within the specified wiring spacing. Here, although the above-mentioned specified wiring spacing is changed according to the film formation condition of the insulating film 1008, the wiring spacing having a minimum pitch in the wiring layer of the semiconductor integrated circuit device is within the above-mentioned specified wiring spacing. Between the wirings close to each other within the specified wiring spacing, reacting species become difficult to go lower gradually by being interrupted by a deposited material near the upper part of the opposing wiring side face (wiring opposing face), as deposition of the insulating film 1008 progresses. Accordingly, the rate of deposition near the lower part of the opposing wiring side face becomes small compared with the rate of deposition near the upper part. Therefore, the thickness of the insulating film 1008 deposited on the opposing wiring side surface does not become uniform, and the thickness near the upper part becomes thicker than the thickness near the lower part.

Accordingly, between the wirings 101b and the wiring 101c, the insulating film 1008 does not become the conformal shape reflecting the shape of the wirings 101b and 101c, but the void (Air-Gap) 1005 as shown in FIG. 5 is generated. Plasma CVD method etc. can be used for film formation of the insulating film 1008, and the above void (Air-Gap) 1005 can be easily formed by adjusting the film formation condition of the insulating film 1008 etc. between adjacent wirings close to each other. On the other hand, in the void formation inhibition zone 102, the void is not formed since the insulating film 1006 between the wiring 101a and the wiring of 101b is remained without being removed, the parasitic capacitance of the wirings 101a and 101b is increased proportionately, and the propagation delay time of the signal in the wirings 101a and 101b or the clock can be enlarged. In order to acquire larger propagation delay time by setting a shorter length for the void formation inhibition zone 102, it is important to make the dielectric constant of the insulating film 1006 between the wirings 101b and 101a higher than the dielectric constant of the insulating film 1008 deposited for forming the void 1005. At this point, it is desirable to make the insulating film 1008 to be a low dielectric constant insulating film, such as SiOF and SiOC, and to make the insulating film 1006 to be a silicon oxide film or a nitrogen silicon film like the above-described example.

Note that, in the present embodiment, since the upper surface and side surface of the wirings 101a to 101c are covered with the insulating film 1004 as an barrier insulating film, the conductive barrier film 1002 can be omitted in the wirings 101a to 101c, and the wirings 101a to 101c can also be formed only with the main conductor film 1003 formed of copper.

Next, to dissolve a step made on the upper surface of the insulating film 1008, a planarizing step by means of CMP is performed, so that the wiring layer shown in FIG. 5 is obtained.

What is claimed is:

1. A method of manufacturing a semiconductor integrated circuit device, the method comprising:
    a first step of performing a circuit design of a semiconductor integrated circuit device;
    a second step of performing a layout design of the semiconductor integrated circuit device based on information of the circuit design; and
    a third step of manufacturing the semiconductor integrated circuit device based on information on the layout design, wherein
    an existence of a timing constraint violation is determined in the second step, and in a case where the timing constraint violation is detected, a void formation inhibition zone is set up in a part of an adjacent wiring spacing, and
    a first insulating film is formed in the adjacent wiring spacing in the void formation inhibition zone in the third step, and a void is formed in the adjacent wiring spacing outside of the void formation inhibition zone.

2. The method of manufacturing the semiconductor integrated circuit device according to claim 1, wherein
    a length of the void formation inhibition zone set up in the adjacent wiring spacing is determined in the second step, corresponding to an additional propagation delay time of a signal or a clock required for dissolution of the timing constraint violation.

3. The method of manufacturing the semiconductor integrated circuit device according to claim 1, wherein the third step further comprises:
    a fourth step of forming a first wiring trench and a second wiring trench that are mutually adjacent to the first insulating film;
    a fifth step of burying a conductor film in the first wiring trench and the second wiring trench to form a first wiring and a second wiring adjacent to each other, respectively;
    a sixth step of remaining the first insulating film in the void formation inhibition zone, and removing the first insulating film outside the void formation inhibition zone within the first insulating film between the first wiring and the second wiring; and
    a seventh step of forming a second insulating film on an upper part of the first wiring and the second wiring and on an upper part of the remained first insulating film so that a void is formed between the first wiring and the second wiring outside the void formation inhibition zone.

4. The method of manufacturing the semiconductor integrated circuit device according to claim 3, wherein
    the void formation inhibition zone is set up in the second step, so that the void is formed on both sides of the first insulating film remained in the seventh step.

5. The method of manufacturing the semiconductor integrated circuit device according to claim 3, wherein
    a dielectric constant of the first insulating film is higher than a dielectric constant of the second insulating film.

6. The method of manufacturing the semiconductor integrated circuit device according to claim 5, wherein
    the first insulating film is a silicon oxide film or a silicon nitride film, and the second insulating film is a low dielectric constant insulating film.

7. The method of manufacturing the semiconductor integrated circuit device according to claim 6, wherein
    the low dielectric constant insulating film is a SiOF film or a SiOC film.

8. A method of manufacturing a semiconductor integrated circuit device, the method comprising:
    a placing step of determining positions of a logic block, a flip-flop, and a buffer;
    a routing step of determining positions of a clock wiring and a signal wiring;
    a verification step of verifying an operation speed; and
    a manufacturing step of manufacturing the semiconductor integrated circuit device, and a void is formed in an adjacent wiring spacing between adjacent wirings close to each other within a specified spacing in the manufacturing step, wherein a void formation inhibition zone is set up in a part of the adjacent wiring spacing in the verification step in a case where a timing constraint violation is detected, and an insulating film is made to remain in the adjacent wiring spacing in the void formation inhibition zone, which is set up in the verification step, in the manufacturing step.

9. A method of manufacturing a semiconductor integrated circuit device, the method comprising:

a placing step of determining positions of a logic block, a flip-flop, and a buffer;

a routing step of determining positions of clock wirings and signal wirings;

a verification step of verifying an operation speed of the semiconductor integrated circuit device; and a manufacturing step of manufacturing the semiconductor integrated circuit device, wherein the verification step further includes:

a delay time computing step of computing a propagation delay time of a clock in each of the clock wirings, and a propagation delay time of a signal in each of the signal wirings based on a parasitic resistance, a parasitic capacitance, and a wiring length of each of the clock wirings and in each of the signal wirings;

a timing constraint violation determination step of determining existence of a timing constraint violation based on the propagation delay time of the clock and the propagation delay time of the signal computed in the delay time computing step; and a timing optimization step of dissolving the timing constraint violation in the case where the timing constraint violation is detected in the timing constraint violation determination step, and wherein the timing optimization step further includes:

a first step of determining a length of a void formation inhibition zone to be set up according to an additional propagation delay time of a signal or a clock required for dissolution of the timing constraint violation;

a second step of specifying an optimization-target wiring which is given the additional propagation delay time of the signal or the clock and an adjacent wiring close to the optimization-target wiring having a spacing within a specified spacing to compare a length of the adjacent wiring with the length determined in the first step; and a third step of setting up the void formation inhibition zone having a length equal to the length determined in the first step between the optimization-target wiring and the adjacent wiring when, in the second step, the length of the adjacent wiring is determined to be longer than the length determined in the first step.

10. The method of manufacturing a semiconductor integrated circuit device according to claim 9, wherein, in a case where there exists a plurality of adjacent wirings close to the optimization-target wiring within the specified spacing in the second step, a sum of each length of a plurality of adjacent wirings is compared with the length determined in the first step.

11. The method of manufacturing a semiconductor integrated circuit device according to claim 10, wherein, in the third step, the void formation inhibition zone is respectively set up between the optimization-target wiring and each of the plurality of the adjacent wirings, and a sum of each length of a plurality of the set void formation inhibition zones is made to be equal to the length determined in the first step.

12. The method of manufacturing a semiconductor integrated circuit device according to claim 9, wherein the timing optimization step further comprises:

a fourth step of determining a length of a dummy wiring to be set up according to a shortage propagation delay time of the signal or the clock acquired by subtracting the propagation delay time of the signal or the clock obtained by eliminating all voids between the optimization-target wiring and the adjacent wiring from the additional propagation delay time of the signal and the clock required for dissolution of the timing constraint violation, in the case in the second step, where the length of the adjacent wiring being determined to be shorter than the length determined in the first step;

a fifth step of determining existence of a zone for forming the dummy wiring having the length determined in the fourth step in a surrounding of the optimization-target wiring; and a sixth step of setting up the dummy wiring to have a length equal to the length determined in the fourth step and to be close to the optimization-target wiring having a spacing within the specified spacing, in the case where the zone for forming the dummy wiring is determined to exist in the fifth step, and wherein, in the third step, a plurality of the void formation inhibition zones covering allover the adjacent wiring spacings between the optimization-target wiring and the adjacent wiring and between the optimization-target wiring and the dummy wiring are set up respectively after the sixth step.

13. The method of manufacturing a semiconductor integrated circuit device according to claim 9, wherein the manufacturing step further comprises:

a seventh step of forming a first wiring trench and a second wiring trench close to a first insulating film mutually within the specified spacing;

an eighth step of burying a conductor film in the first and the second wiring trenches to form the optimization-target wiring and the adjacent wiring adjacent to each other having a spacing within the specified spacing, respectively;

a ninth step of forming a photo-resist pattern covering the void formation inhibition zone set up in the third step on the first insulating film between the optimization-target wiring and the adjacent wiring;

a tenth step of etching to remove the first insulating film by using the photo-resist pattern as a mask; and an eleventh step of forming a second insulating film on an upper part of the first and second wiring, and on the upper part of the first insulating film remained so that a void may be formed in the portion where the first insulating film between the optimization-target wiring and the second wiring is removed.

14. The method of manufacturing a semiconductor integrated circuit device according to claim 13, wherein the void formation inhibition zone is set up in the third step so that the void is formed on both sides of the first insulating film remained in the tenth step.

15. The method of manufacturing a semiconductor integrated circuit device according to claim 13, wherein a dielectric constant of the first insulating film is higher than a dielectric constant of the second insulating film.

16. The method of manufacturing a semiconductor integrated circuit device according to claim 15, wherein the first insulating film is a silicon oxide film or a silicon nitride film, and the second insulating film is a low dielectric constant insulating film.

17. The method of manufacturing a semiconductor integrated circuit device according to claim 16, wherein
the low dielectric constant insulating film is a SiOF film or a SiOC film.

18. A method of manufacturing a semiconductor integrated circuit device, the method comprising:
manufacturing the semiconductor integrated circuit device based on information of a layout design, wherein
an existence of a timing constraint violation is determined, and in a case where the timing constraint violation is detected, a void formation inhibition zone is set up in a part of an adjacent wiring spacing, and
a first insulating film is formed in the adjacent wiring spacing in the void formation inhibition zone, and a void is formed in the adjacent wiring spacing outside of the void formation inhibition zone.

19. The method of manufacturing the semiconductor integrated circuit device according to claim 18, wherein
a length of the void formation inhibition zone set up in the adjacent wiring spacing is determined corresponding to an additional propagation delay time of a signal or a clock required for dissolution of the timing constraint violation.

20. The method of manufacturing the semiconductor integrated circuit device according to claim 18, further comprising:
forming a first wiring trench and a second wiring trench that are mutually adjacent to the first insulating film;
burying a conductor film in the first wiring trench and the second wiring trench to form a first wiring and a second wiring adjacent to each other, respectively;
leaving the first insulating film in the void formation inhibition zone remaining and removing the first insulating film outside the void formation inhibition zone within the first insulating film between the first wiring and the second wiring; and
forming a second insulating film on an upper part of the first wiring and the second wiring and on an upper part of the remained first insulating film so that a void is formed between the first wiring and the second wiring outside the void formation inhibition zone.

21. The method of manufacturing the semiconductor integrated circuit device according to claim 20, wherein
the void formation inhibition zone is set up so that the void is formed on both sides of the first insulating film left remaining.

22. The method of manufacturing the semiconductor integrated circuit device according to claim 20, wherein
a dielectric constant of the first insulating film is higher than a dielectric constant of the second insulating film.

23. The method of manufacturing the semiconductor integrated circuit device according to claim 22, wherein
the first insulating film is a silicon oxide film or a silicon nitride film, and the second insulating film is a low dielectric constant insulating film.

24. The method of manufacturing the semiconductor integrated circuit device according to claim 23, wherein
the low dielectric constant insulating film is a SiOF film or a SiOC film.

25. A non-transitory computer readable medium with an executable program stored thereon to cause a computer to execute performing of a layout design of a semiconductor integrated circuit device based on information of the semiconductor integrated circuit device design, executing the following steps:
a placing step of determining positions of a logic block, a flip-flop, and a buffer;
a routing step of determining positions of clock wirings and signal wirings; and
a verification step of verifying an operation speed of the semiconductor integrated circuit device, wherein
the verification step further includes:
a delay time computing step of computing a propagation delay time of a clock in each of the clock wirings, and a propagation delay time of a signal in each of the signal wirings based on a parasitic resistance, a parasitic capacitance, and a wiring length of each of the clock wirings and in each of the signal wirings;
a timing constraint violation determination step of determining existence of a timing constraint violation based on the propagation delay time of the clock and the propagation delay time of the signal computed in the delay time computing step; and
a timing optimization step of dissolving the timing constraint violation in the case where the timing constraint violation is detected in the timing constraint violation determination step, and wherein
the timing optimization step further includes:
a first step of determining a length of a void formation inhibition zone to be set up according to an additional propagation delay time of a signal or a clock required for dissolution of the timing constraint violation;
a second step of specifying an optimization-target wiring which is given the additional propagation delay time of the signal or the clock and an adjacent wiring close to the optimization-target wiring having a spacing within a specified spacing to compare a length of the adjacent wiring with the length determined in the first step; and
a third step of setting up the void formation inhibition zone having a length equal to the length determined in the first step between the optimization-target wiring and the adjacent wiring when, in the second step, the length of the adjacent wiring is determined to be longer than the length determined in the first step.

26. The non-transitory computer readable medium with an executable program stored thereon to cause a computer to execute performing of a layout design of a semiconductor integrated circuit device based on information of the semiconductor integrated circuit device design according to claim 25, further executing the following steps:
in a case where there exists a plurality of adjacent wirings close to the optimization-target wiring within the specified spacing in the second step, comparing a sum of each length of a plurality of adjacent wirings with the length determined in the first step.

27. The non-transitory computer readable medium with an executable program stored thereon for performing a layout design of a semiconductor integrated circuit device based on information of the semiconductor integrated circuit device design according to claim 25, further executing the following steps:
in the third step, setting up the void formation inhibition zone respectively between the optimization-target wiring and each of the plurality of the adjacent wirings, and making a sum of each length of a plurality of the set void formation inhibition zones to be equal to the length determined in the first step.

28. The non-transitory computer readable medium with an executable program stored thereon to cause a computer to execute performing of a layout design of a semiconductor integrated circuit device based on information of the semi conductor integrated circuit device design according to claim 25, further executing the following steps:

- a fourth step of determining a length of a dummy wiring to be set up according to a shortage propagation delay time of the signal or the clock acquired by subtracting the propagation delay time of the signal or the clock obtained by eliminating all voids between the optimization-target wiring and the adjacent wiring from the additional propagation delay time of the signal and the clock required for dissolution of the timing constraint violation, in the case in the second step, where the length of the adjacent wiring being determined to be shorter than the length determined in the first step;
- a fifth step of determining existence of a zone for forming the dummy wiring having the length determined in the fourth step in a surrounding of the optimization-target wiring; and
- a sixth step of setting up the dummy wiring to have a length equal to the length determined in the fourth step and to be close to the optimization-target wiring having a spacing within the specified spacing, in the case where the zone for forming the dummy wiring is determined to exist in the fifth step, and wherein,
- in the third step, a plurality of the void formation inhibition zones covering allover the adjacent wiring spacings between the optimization-target wiring and the adjacent wiring and between the optimization-target wiring and the dummy wiring are set up respectively after the sixth step.

* * * * *